(12) United States Patent
Kawa et al.

(10) Patent No.: US 9,735,227 B2
(45) Date of Patent: Aug. 15, 2017

(54) 2D MATERIAL SUPER CAPACITORS

(71) Applicant: SYNOPSYS, INC., Mountain View, CA (US)

(72) Inventors: Jamil Kawa, Campbell, CA (US); Victor Moroz, Saratoga, CA (US)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 14/817,078

(22) Filed: Aug. 3, 2015

(65) Prior Publication Data

US 2017/0040411 A1    Feb. 9, 2017

(51) Int. Cl.
*H01L 49/02* (2006.01)
*H01L 21/285* (2006.01)
*G06F 17/50* (2006.01)
*H01G 4/30* (2006.01)
*H01G 4/008* (2006.01)

(52) U.S. Cl.
CPC .......... *H01L 28/60* (2013.01); *G06F 17/5036* (2013.01); *G06F 17/5068* (2013.01); *H01G 4/008* (2013.01); *H01G 4/306* (2013.01); *H01L 21/28525* (2013.01)

(58) Field of Classification Search
CPC ......... H01L 28/60; H01L 28/87; H01G 4/005; H01G 4/008; H01G 4/306
See application file for complete search history.

(56) References Cited

U.S. PATENT DOCUMENTS

| | | | |
|---|---|---|---|
| 6,563,235 B1 | 5/2003 | McIntyre et al. | |
| 2010/0321858 A1 | 12/2010 | Hsu et al. | |
| 2011/0286147 A1 | 11/2011 | Chen et al. | |
| 2011/0307235 A1 | 12/2011 | Wu | |
| 2013/0050901 A1* | 2/2013 | Lee .................. | H01G 4/008 361/321.4 |
| 2013/0194723 A1 | 8/2013 | Felten et al. | |
| 2013/0270675 A1* | 10/2013 | Childs ................ | H01L 23/5226 257/532 |
| 2013/0295374 A1 | 11/2013 | Tang et al. | |

(Continued)

OTHER PUBLICATIONS

Shi et al., 'Boron nitride-graphene nanocapacitor and the origins of anomalous size-dependent increase of capacitance,' 2014, Nano Lett., vol. 14, pp. 1739-1744.*

(Continued)

*Primary Examiner* — Bryan Junge
(74) *Attorney, Agent, or Firm* — Haynes Beffel & Wolfeld LLP

(57) ABSTRACT

Devices and methods are described relating to capacitor energy storage devices that are small in size and have a high energy stored to volume ratio. The capacitor devices include 2D material electrodes. The capacitor devices offer very fine granularity with high stacking possibilities which may be used in super capacitors and capacitor arrays. The devices include interleaved laminations 2D material electrode layers, for example graphene, and dielectric layers, for example Hafnium Oxide. In an embodiment a capacitor device includes 10,000 layers of interleaved graphene separated by 9,999 layers of HfO. Odd layers of the graphene are electrically connected to a first terminal and even layers of graphene are electrically connected to a second terminal of the capacitor device.

17 Claims, 15 Drawing Sheets

(56) References Cited

U.S. PATENT DOCUMENTS

2015/0116906 A1* 4/2015 Thevasahayam ...... H01G 11/28
361/502
2016/0056228 A1* 2/2016 Jou .................... H01L 23/5223
257/532

OTHER PUBLICATIONS

Leong, W.S., et al., "Low-Contact-Resistance Graphene Devices with Nickel-Etched-Graphene Contacts," Department, National University of Singapore, Singapore, 24 pages.

PCT /US2016/044331—International Search Report Nov. 8, 2016, 3 pages.

* cited by examiner

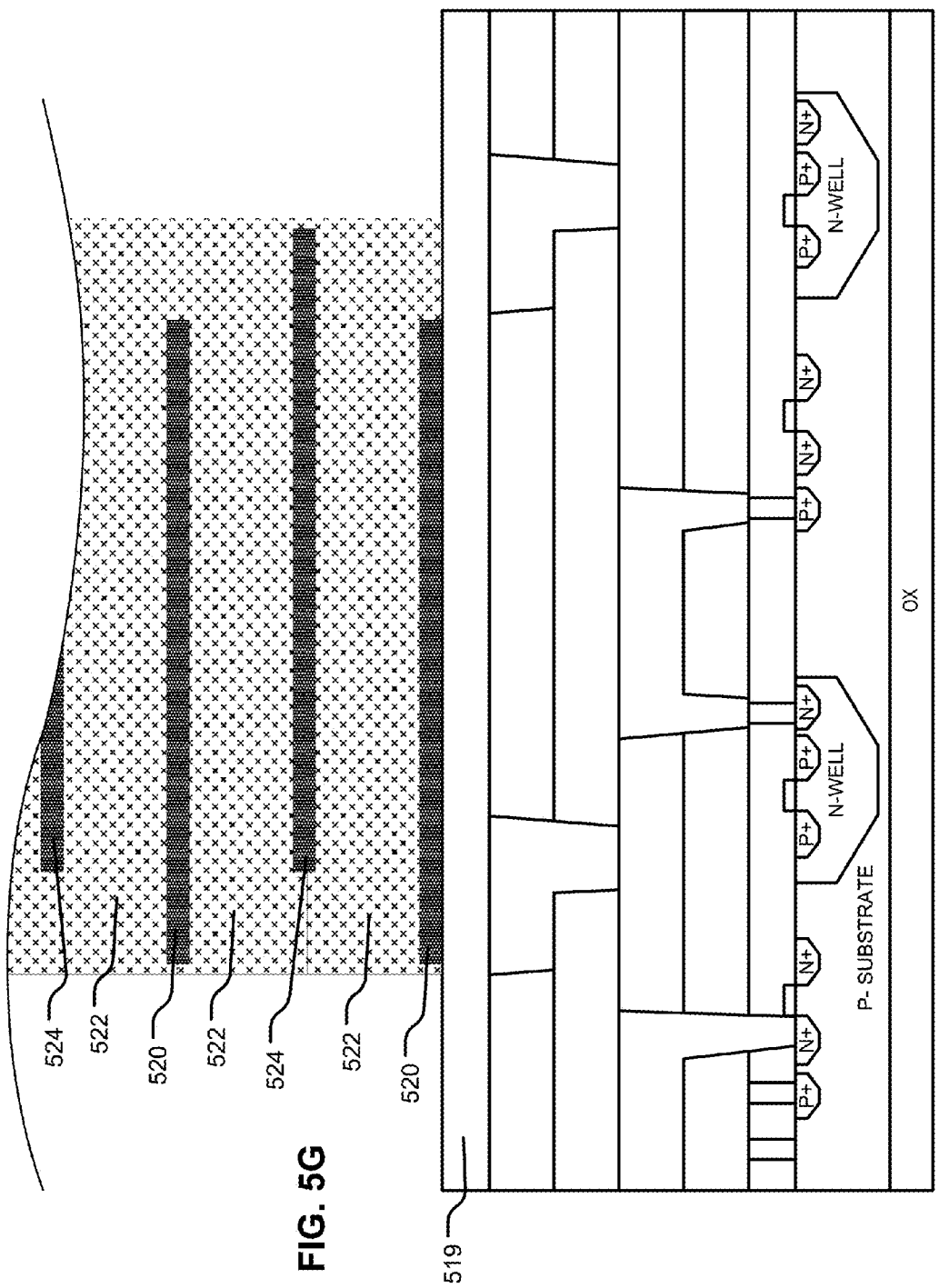

2D MATERIAL SUPER CAPACITORS

BACKGROUND

Field of the Invention

The invention relates to super capacitor devices with 2D material electrodes, and more particularly to stacked capacitor devices including graphene electrodes.

Description of Related Art

The Internet of Things (IOT) is a growing area of technology. The IOT often calls for autonomous sensors that encompass renewable energy source harvesters and On-Chip energy storage. On-Chip energy storage must have energy capacity capable of supplying energy to an IOT device for an extended period of time, especially if the source of renewable energy is highly intermittent. Examples of renewable energy sources to harvest include kinetic, solar, and thermal. Ideally a full charge would last at least several days. Current energy storage technology, for example battery technology, does not have the energy storage density required to reduce the size of the energy storage device while storing the energy required to run an IOT device for the desired time.

SUMMARY

An opportunity therefore arises to create an energy storage device that is small in size and has a high energy stored to volume ratio. Devices and method related to capacitor devices including 2D material electrodes are described herein. The capacitor devices offer very fine granularity with high stacking possibilities which may be used in super capacitors and capacitor arrays.

Roughly described, the devices include interleaved laminations of electrically conductive 2D material electrode layers, for example graphene, and dielectric layers, for example Hafnium Oxide. In an embodiment a capacitor device includes 10,000 interleaved of layers graphene separated by 9,999 layers of HfO. Odd layers of the graphene are electrically connected to a first terminal and even layers of graphene are electrically connected to a second terminal of the capacitor device.

The methods, related to the capacitor device, include a method of manufacture, a method for simulating a process flow for fabrication; and a method for simulating an integrated circuit with a capacitor device. The simulation methods may be used to extract parameters of the capacitor device and circuits including the capacitor device.

Further, specific example layouts are described. The invention can be reflected in and be present in layout files, macrocells, lithographic masks and integrated circuit devices incorporating these principles, as well as fabrication methods.

The above summary of the invention is provided in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description that is presented later. Particular aspects of the invention are described in the claims, specification and drawings.

BRIEF DESCRIPTION OF THE DRAWINGS

The invention will be described with respect to specific embodiments thereof, and reference will be made to the drawings, in which:

FIGS. 5B, 5C, 5D, 5E, 5F, 5G, 5H and 5I are cross-sectional views of partially formed devices according to the fabrication steps of FIG. 5A.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

As used herein, layers which are termed "above" or "below" other layers, can in various embodiments be separated from such other layers by one or more intervening layers. If no intervening layer is intended, then the terms "immediately above" or "immediately below" are used herein. The same interpretation is intended for layers being described as "superposing", "underlying" or "over" another layer.

A "2D material layer", as used herein, is layer that includes or consists essentially of one or more sub-layers of doped or undoped "2D material". A "2D material", as used herein, is a material that, within each sub-layer, tends to form strong bonds such as covalent bonds, whereas between sub-layers, tends to form relatively weaker bonds such as Van der Waals bonds. Electrons in each sub-layer of these materials are free to move in the two-dimensional plane, but their motion in the third dimension is restricted and governed by quantum mechanics. Graphene is an example of a "2D material" in which each sub-layer has a thickness of only a single atom. Molybdenum disulfide ($MoS_2$) is an example of a "2D material" in which each sub-layer has three internal monolayers: a middle monolayer of Mo, sandwiched between upper and lower monolayers of S. The bonds between the Mo atoms and the S atoms are covalent, whereas bonds between the lower S level of one layer and the upper S level of the layer below it are Van der Waals bonds. Other examples of "2D materials" include tungsten diselenide ($WSe_2$), niobium diselenide ($NbSe_2$), boron nitride (BN), tungsten sulfide ($WS_2$), phosphorene (PR3), stanananene (Sn), and the transition metal di-chalcogenides. A "2D material layer" typically has a thickness of less than one nanometer. Those 2D materials which are electrically conductive are of particular interest herein.

Figure 1:
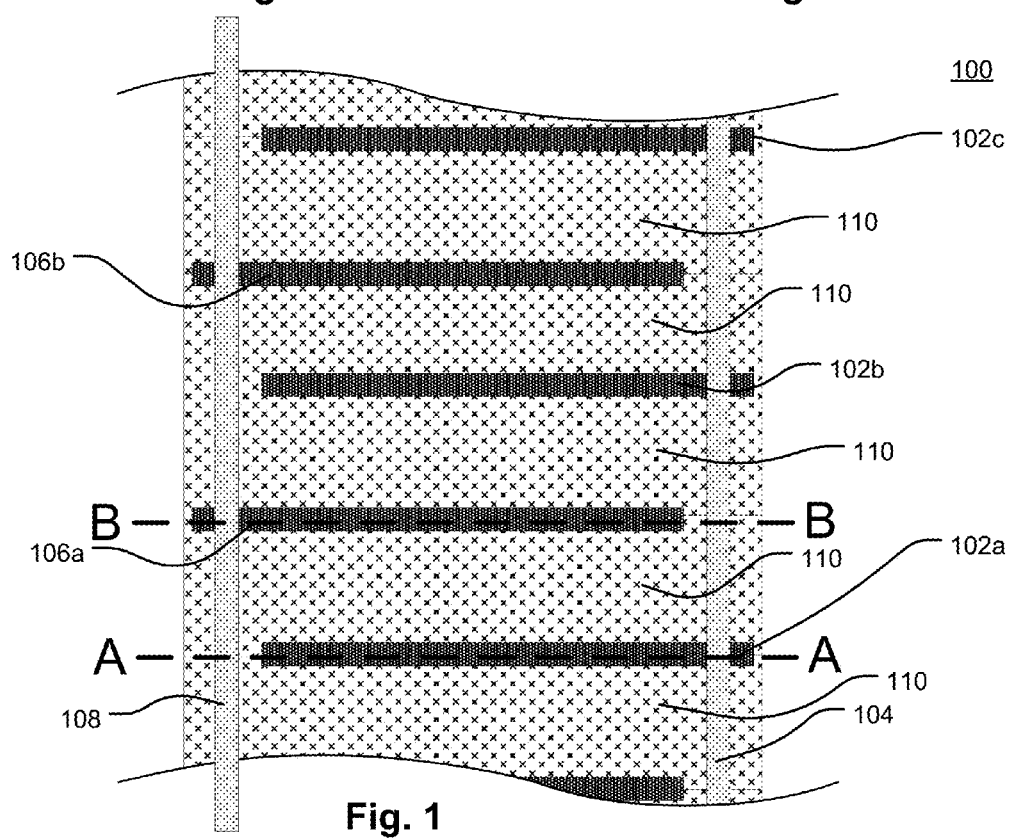
FIG. 1 is a cross-sectional view of a portion of a stacked capacitor device.

FIG. 1 is a cross-sectional view of an example portion of a capacitor 100 including 2D material electrode layers according to the technology disclosed herein. Note that FIG. 1 is illustrative in nature and is not necessarily to scale or proportion. For example, the layer thicknesses versus lengths of a layer may be exaggerated to more clearly show the orientation of the multiple stacked layers.

The capacitor 100 includes a first set of conductive layers 102a 102b and 102c, also referred to as odd layers, electrically connected to a first interlayer conductor 104. The capacitor 100 further includes a second set of conductive layers 106a and 106b, also referred to as even layers, electrically connected to a second interlayer conductor 108. The conductive layers may comprise a conductive 2D material. For example, each layer may comprise a monolayer of graphene. As noted above, graphene is an example of a "2D material" in which each sub-layer has a thickness of only a single atom. A single atomic layer of graphene is highly conductive, and therefore ideal for use as an electrode of a capacitor. In embodiments, the first and second set of conductive layers may comprise the same or different material. Further, the layers within a set of conductive layers may comprise the same or different materials.

Figures 2A, 2B:
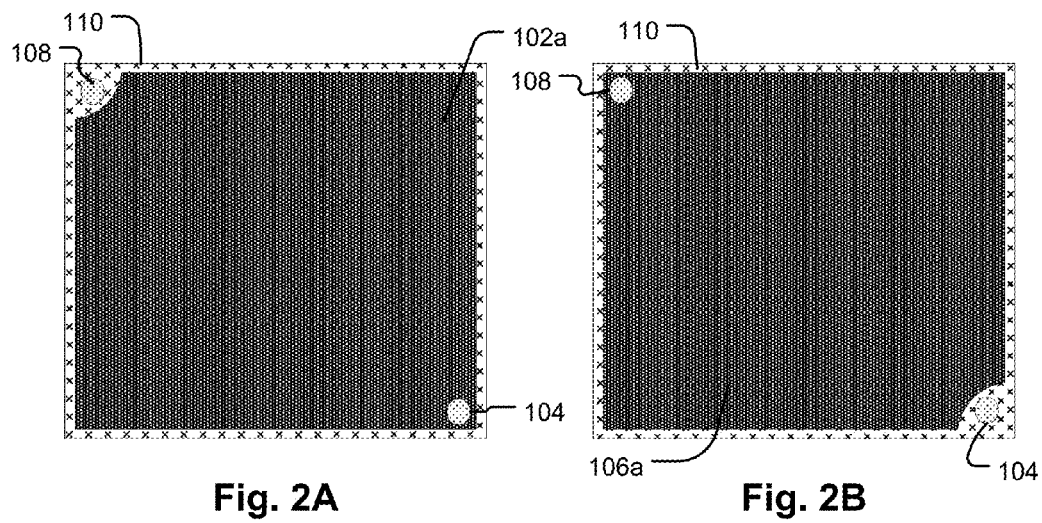
FIG. 2A is a cross-sectional view along A-A of FIG. 1
FIG. 2B is a cross-sectional view along B-B of FIG. 1

As shown in FIG. 1, the first and second set of conductive layers 102, 102b, 102c, 106a and 106b are configured in an interleaved pattern, wherein the conductive layers of the first and second set of conductive layers are separated by one or more layers of dielectric material 110. FIG. 2a shows a cross section of odd layer 102a and FIG. 2b shows a cross-section of even layer 106a. As shown in FIG. 2a, in odd conductive layer 102a the interlayer conductor 104 corresponding to odd layers is contacting the conductive layer 102a, and the odd conductive layer 102a is patterned so that interlayer conductor 108 corresponding to even layers does not contact the layer. Similarly as shown in FIG. 2b, in even conductive layer 106a the interlayer conductor 108 corresponding to even layers is contacting the conductive layer 106a, and the even conductive layer 106a is patterned so that interlayer conductor 104 corresponding to odd layers does not contact the layer. In embodiments, the even and odd layers may be patterned in others ways so that the layer is electrically contacting the corresponding interlayer conductor and not contacting the non-corresponding interlayer conductor.

The interlayer conductors 104 and 108 may comprise metal, for example nickel, aluminum, molybdenum, cobalt, and tungsten. Regarding nickel, see for example "Low-Contact-Resistance Graphene Devices with Nickel-Etched-Graphene Contacts" by Leong et al., incorporated herein by reference. Further, the interlayer conductors may comprise layers of the same 2D material as the conductive layers, for example graphene.

In embodiments the dielectric material 110 may be Hafnium Oxide (HfO). HfO has a high relative permittivity, also referred to as high dielectric constant, ranging from 20 to 40. In embodiments, the dielectric material may have a dielectric permittivity higher than 40, which provides the benefit of being able achieve thin dielectric layers in terms of dielectric properties, however, the layers must still provide enough thickness to physically to avoid electron tunneling between the graphene layers. The thickness of HfO between 2D material electrodes may range from mm to 20 nm. In an embodiment, the HfO thickness between 2D material electrodes is 2 nm. Other materials suitable as dielectric layers between 2D material electrodes include other high-k dielectrics like HfSiON, HfSiO, AlO, and ZnO.

In the arrangement shown in FIG. 1, the capacitor 100 is an energy storage device that may be considered to comprise a plurality of sub-capacitors, wherein each sub-capacitor is itself also considered herein to be a capacitor. Each sub-capacitor is considered herein to be a sub-capacitor layer, wherein the sub-capacitor layers are stacked to form the overall capacitor 100. Adjacent sub-capacitor layers may share elements, for example a conductive layer may be considered to be included in two different sub-capacitor layers. A sub-capacitor layer comprises a conductive layer of the first set (odd layer), a conductive layer of the second set (even layer) and a dielectric material layer between the odd and even conductive layers. In the example shown in FIG. 1, a first sub-capacitor, which may also be considered a first capacitor, comprises conductive layers 102a and 106a, and the dielectric material layer 110 between the two conductive layers. A second sub-capacitor, which may also be considered a second capacitor, comprises conductive layers 106a and 102b, where conductive layer 106a is also included in the first capacitor, and the dielectric material layer 110 between conductive layers 106a and 102b.

The arrangements described above including 2D material conductive layers, acting as electrodes, and thin dielectric layers provide thin sub-capacitors. The thin sub-capacitor layer allows for many sub-capacitor layers to be laminated together to create a capacitor device with a relatively low overall device thickness with relatively high capacitance for device area. In embodiments a device may have more than 5000 sub-capacitor layers, for example 10,000 sub-capacitors layers. A capacitor device may be designed to include a specific number of sub-capacitor layers to achieve a specific total capacitance. Further, the capacitor device may be designed with sub-capacitor layers having different properties from one another to achieve a specific total capacitance.

In an example device, each dielectric layer is a 2 nm thick HfO dielectric layer, and the conductor layers are ~0.345 picometers thick 2D material electrodes, resulting in a sub-capacitor thickness of ~2.5 nm. For example, a single layer of graphene has a thickness of about 345 picometers, with alternative 2D electrode materials ranging from 0.345 nm to 1 nm. Such a device has a capacitance per unit area of 7 $\mu$F/cm$^2$. Therefore, with a 6 mm by 6 mm die size the capacitance of each sub-capacitor is 2.5 $\mu$F. A device with 10,000 of such sub-capacitors therefore has a total capacitance of 0.025 F.

Figure 3:
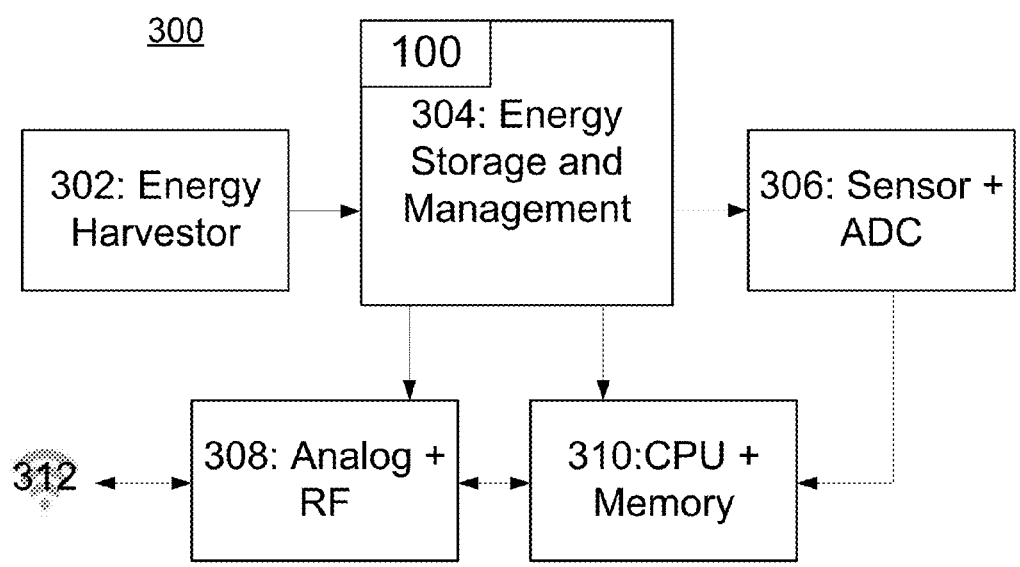
FIG. 3 is a block diagram of an IOT device.

The device described above having a total capacitance of 0.025 F may be used as an energy storage device in an IoT device, such as the device 300 shown in FIG. 3. The device 300 includes an energy harvester 302, and energy storage and management module 304 including a capacitor 100, a sensor and analog/digital converter module 306, an analog and RF input module 308, and a CPU/memory module 310. The device 300 may send and receive wireless signals 312. The example IoT device may have a power consumption of 15 $\mu$J per second. With the device described above, using the 6 mm×6 mm chip with a total capacitor thickness of ~25 $\mu$m, with 10,000 laminated sub-capacitor layers, and therefore the total capacitance of 25 mF, the total energy store would be 40 mJ at 1.8V. The useful energy storage may be about 28 mJ due to capacitor discharge to a lower voltage. With an IoT device having a core operating at 1V, the power stored would have an operating time of 1,000,000 sec, roughly 11 days. An energy harvester, such as a solar panel, could charge such a capacitor in seconds, because unlike a battery, the capacitor 100 has virtually no internal resistance. The physical thickness of such a capacitor at only ~25 $\mu$m is superior to batteries with comparable storage capabilities that have a thickness of ~200 $\mu$m, about 8 times thicker.

Overall Design Process Flow

It is to be understood and appreciated that the process steps and structures described herein do not describe a complete process flow for the manufacture of an integrated circuit. The invention may be practiced in conjunction with various integrated circuit fabrication techniques that are conventionally used in the art, or that are hereafter developed, and only so much of the commonly practiced process steps are included herein as are necessary to provide an understanding of the invention.

FIG. 4 shows a simplified representation of an illustrative integrated circuit design flow incorporating features of the capacitor with 2D material electrode technology. At a high level, the process starts with the product idea (step 400) and is realized in an EDA (Electronic Design Automation) software design process (step 410). When the design is finalized, it can be taped-out (step 427). After tape out, the fabrication process (step 450) and packaging and assembly processes (step 460) occur resulting, ultimately, in finished integrated circuit chips (result 470).

The EDA software design process (step 410) is actually composed of a number of steps 412-430, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the components steps of the EDA software design process (step 410) will now be provided.

System design (step 412): The designers describe the functionality that they want to implement, they can perform what-if planning to refine functionality, check costs, etc. Hardware-software architecture partitioning can occur at this stage. Example EDA software products from Synopsys, Inc. that can be used at this step include Model Architect, System Studio, and DesignWare® products.

Logic design and functional verification (step 414): At this stage, the VHDL or Verilog code for modules in the system is written and the design is checked for functional accuracy. More specifically, the design is checked to ensure that produces the correct outputs in response to particular input stimuli. Example EDA software products from Synopsys, Inc. that can be used at this step include VCS, VERA, DesignWare®, Magellan, Formality, ESP and LEDA products.

Synthesis and design for test (step 416): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this step include Design Compiler®, Physical Compiler, Test Compiler, Power Compiler, FPGA Compiler, Tetramax, and DesignWare® products.

Netlist verification (step 418): At this step, the netlist is checked for compliance with timing constraints and for correspondence with the VHDL/Verilog source code. Example EDA software products from Synopsys, Inc. that can be used at this step include Formality, PrimeTime, and VCS products.

Design planning (step 420): Here, an overall floor plan for the chip is constructed and analyzed for timing and top-level routing. Example EDA software products from Synopsys, Inc. that can be used at this step include Astro and IC Compiler products.

Physical implementation (step 422): The placement (positioning of circuit elements) and routing (connection of the same) occurs at this step. Example EDA software products from Synopsys, Inc. that can be used at this step include the Astro and IC Compiler products.

Analysis and extraction (step 424): At this step, the circuit function is verified at a transistor level, this in turn permits what-if refinement. Example EDA software products from Synopsys, Inc. that can be used at this step include AstroRail, PrimeRail, Primetime, and Star RC/XT products.

Physical verification (step 426): At this step various checking functions are performed to ensure correctness for: manufacturing, electrical issues, lithographic issues, and circuitry. Example EDA software products from Synopsys, Inc. that can be used at this step include the Hercules product.

Tape-out (step 427): This step provides the "tape out" data for production of masks for lithographic use to produce finished chips. Example EDA software products from Synopsys, Inc. that can be used at this step include the CATS® family of products.

Resolution enhancement (step 428): This step involves geometric manipulations of the layout to improve manufacturability of the design. Example EDA software products from Synopsys, Inc. that can be used at this step include Proteus, ProteusAF, and PSMGen products.

Mask data preparation (step 430): This step provides the "tape-out" data for production of masks for lithographic use to produce finished chips. Example EDA software products from Synopsys, Inc. that can be used at this step include the CATS® family of products.

Fabrication Process

After the an integrated circuit and capacitor device has been designed and laid out in accordance with aspects of the invention, and masks have been formed, the device itself can be fabricated using any of a variety of methods now known or developed in the future. The individual steps in the fabrication process need not be altered in order to incorporate features of the invention. Only a high level description of significant steps in the process are described herein, therefore, the details being apparent to the reader. As used herein, no distinction is made between elements "in" or "on" a wafer or substrate.

Figure 5A:
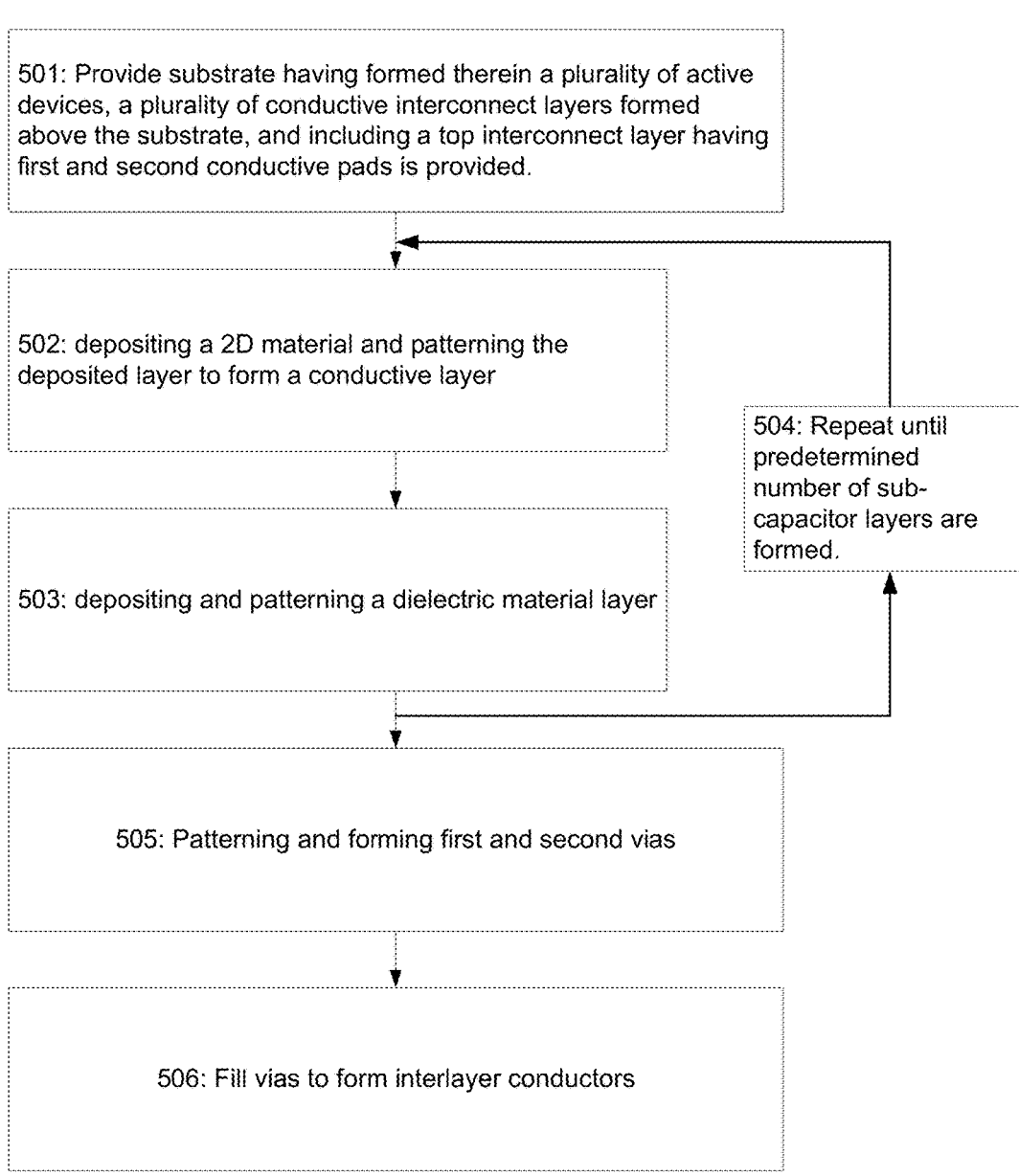
FIG. 5A is a simplified flow chart describing an integrated circuit fabrication process that can implement features of the invention.
Figure 5B:
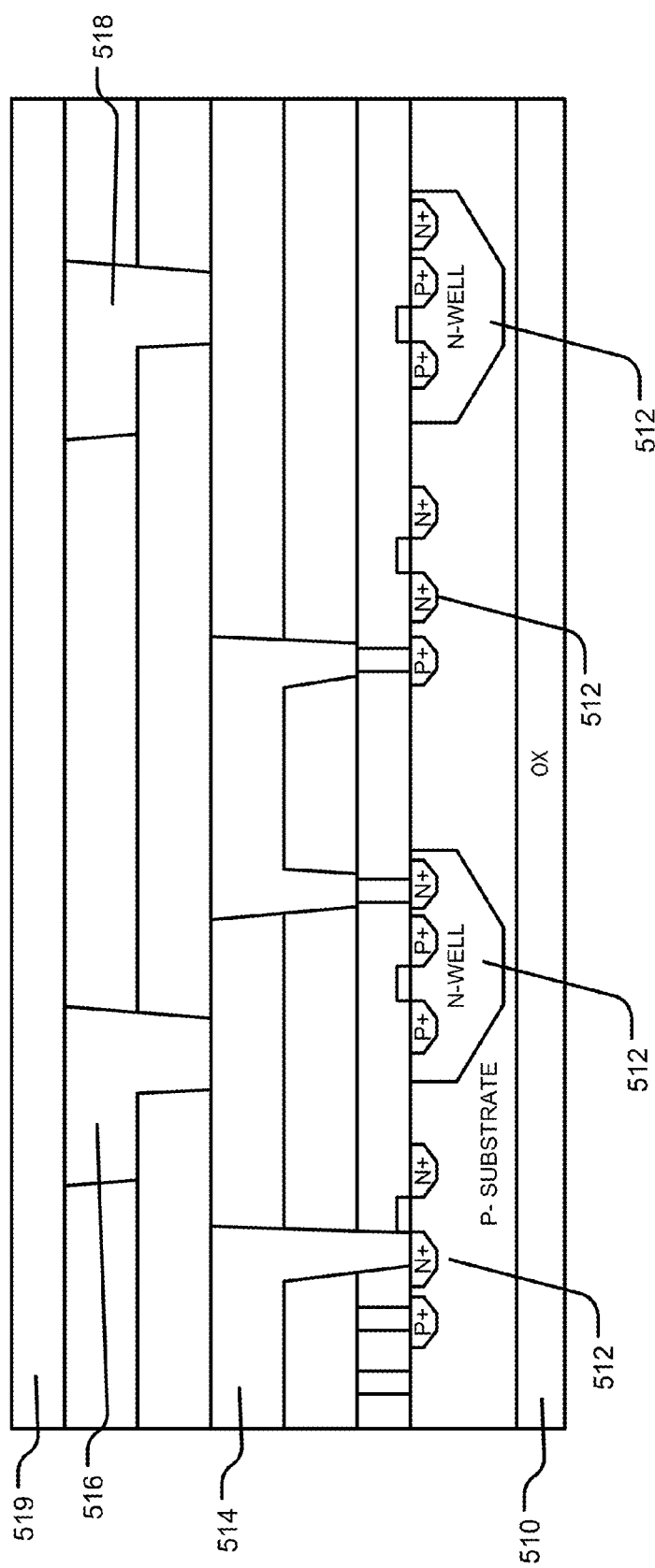
Figure 5C:
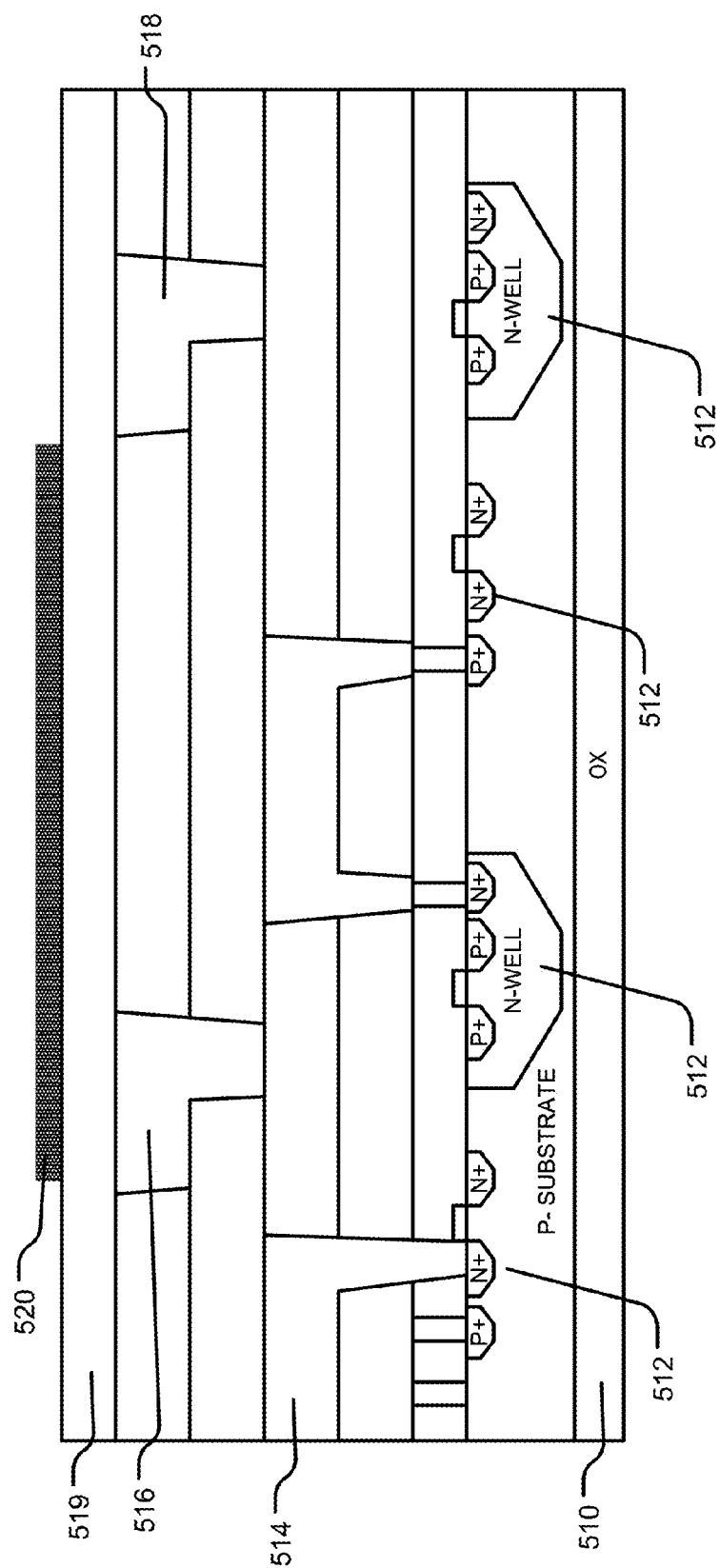
Figure 5D:
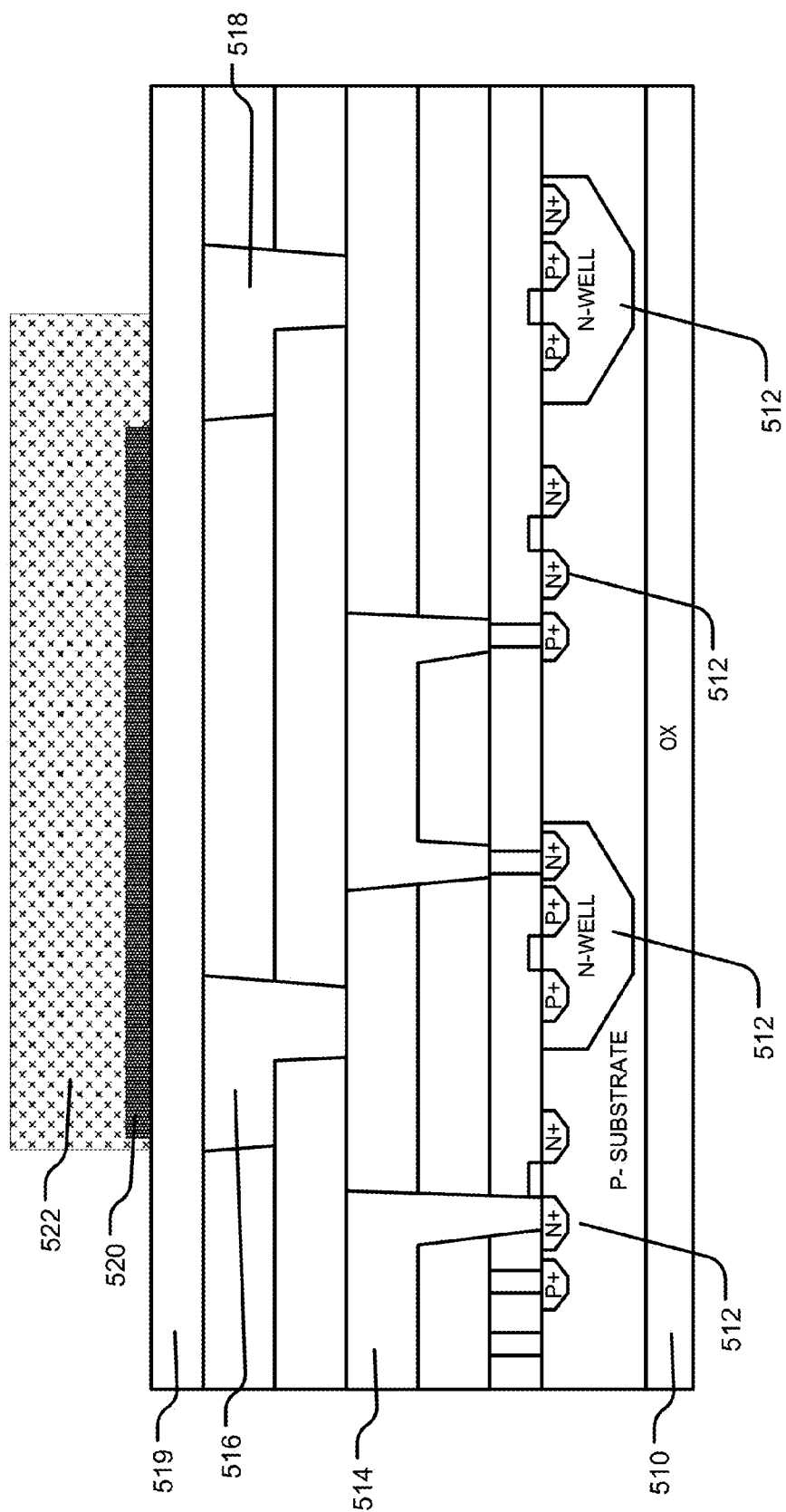

An example of steps to manufacture a capacitor device with 2D material electrode layers is shown in FIG. 5A. The steps of manufacture are compatible with the CMOS flow. Examples illustrating partially formed devices after the fabrication steps of FIG. 5A are shown in FIGS. 5B-5I As shown in step 501 in FIG. 5A and corresponding fabrication illustration in FIG. 5B, a substrate 510 having formed therein a plurality of active devices 512, a plurality of conductive interconnect layers 514 formed above the substrate, and including a top interconnect layer having first and second contact pads 516, 518 is provided. The contact pads may for example be copper. The various features illustrated at each layer in FIG. 5B are symbolic and do not necessarily represent an actual device. Above the top interconnect layer is a passivation layer 519. Following this step 501 are a plurality of sub-capacitor layer forming steps. The sub-capacitor layer forming steps include a step 502 of depositing a 2D material and patterning the deposited layer to form a conductive layer as shown in FIG. 5C wherein an odd conductive layer 520 is formed. As described above, in embodiments the 2D material may be patterned as an odd layer or an even layer. After the step 502 of forming a conductive layer a step 503 of depositing and patterning a dielectric material layer 522 is performed as shown in FIG.

Figure 5E:
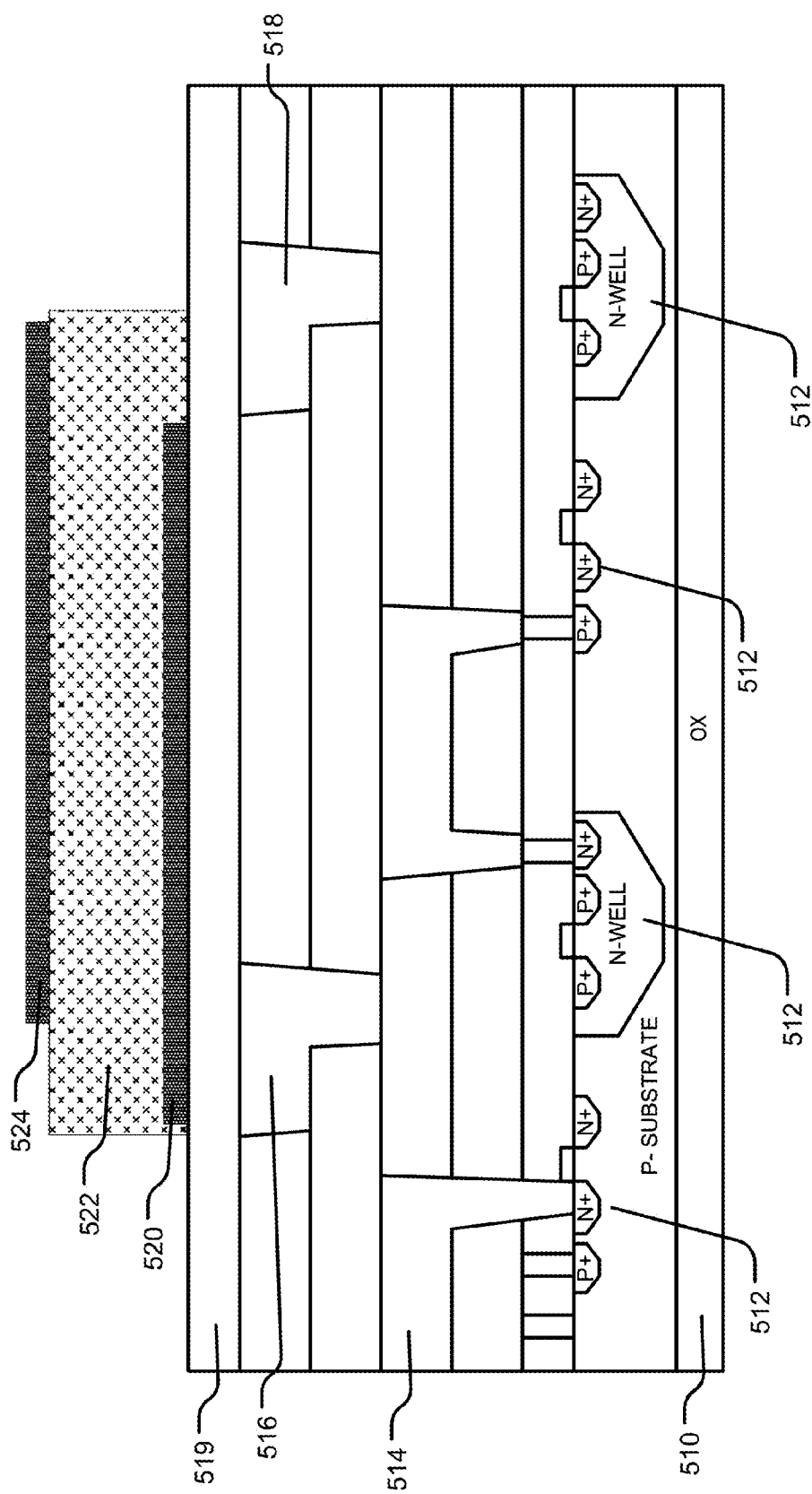
Figure 5F:
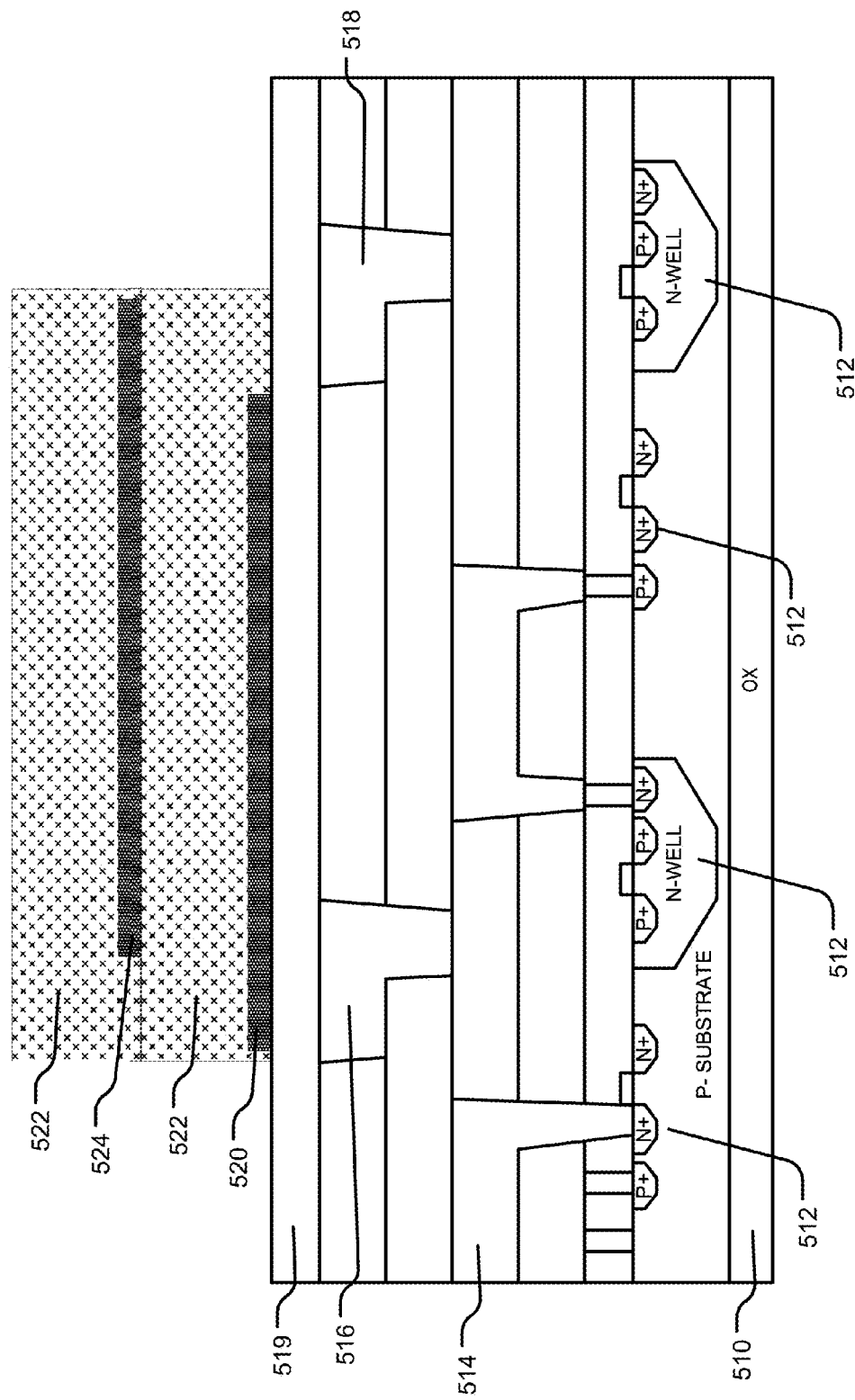

5D. Steps 502 and 503 are repeated in step 504 a plurality of times until a predetermined number of sub-capacitor layers are formed. FIG. 5E shows a fabrication step after step 502 has been repeated once and an even conductive layer 524 is formed. FIG. 5F shows a fabrication step after step 503 has been repeated once and a second dielectric material layer 522 is formed over the even conductive layer 524. FIG. 5G shows the bottom portion of a partially formed capacitor after fabrication steps 502 and 503 have been repeated the predetermined amount of times. The patterning in the above steps is done using masks prepared in step 430.

Figure 5H:
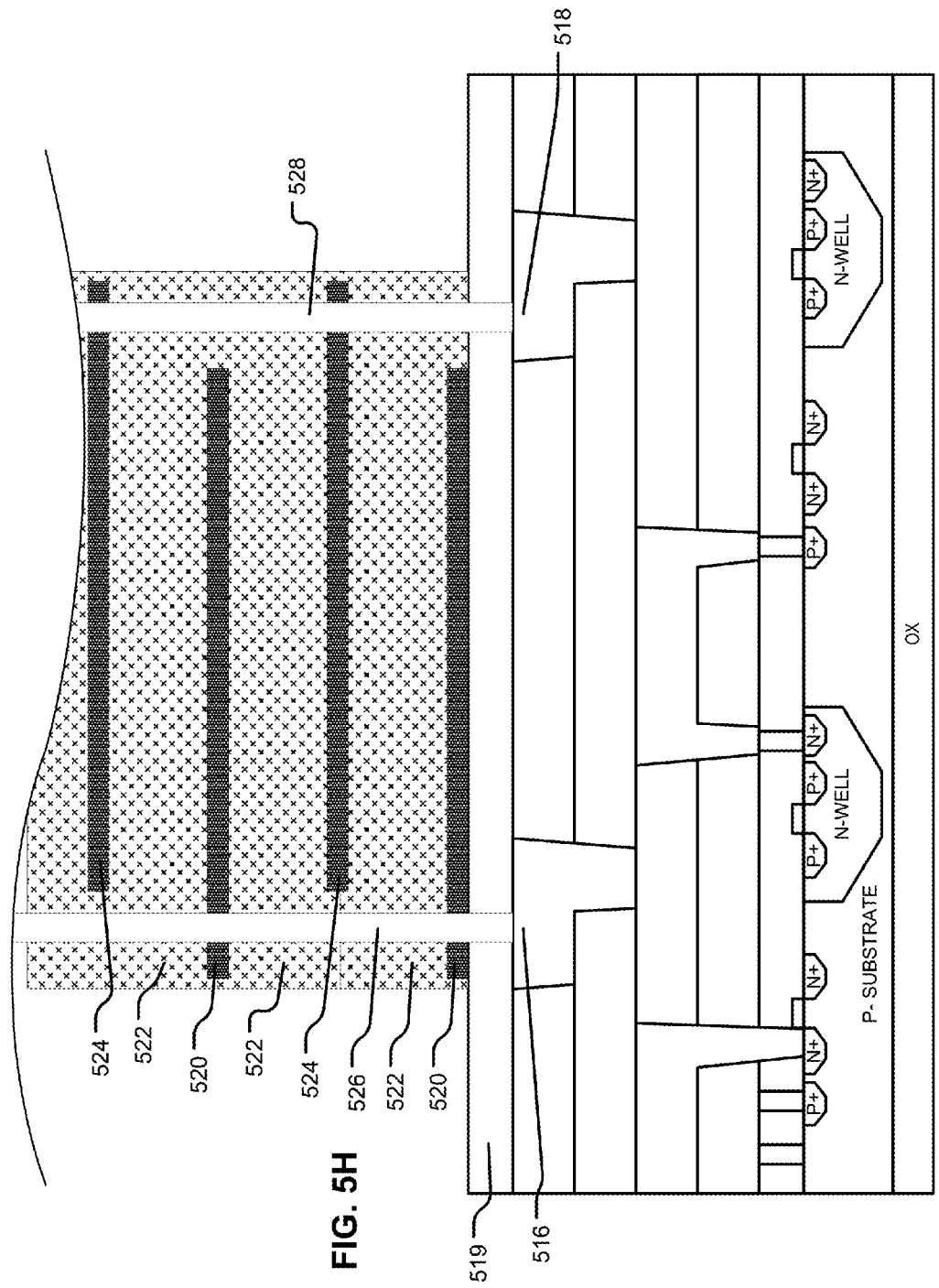
Figure 5I:
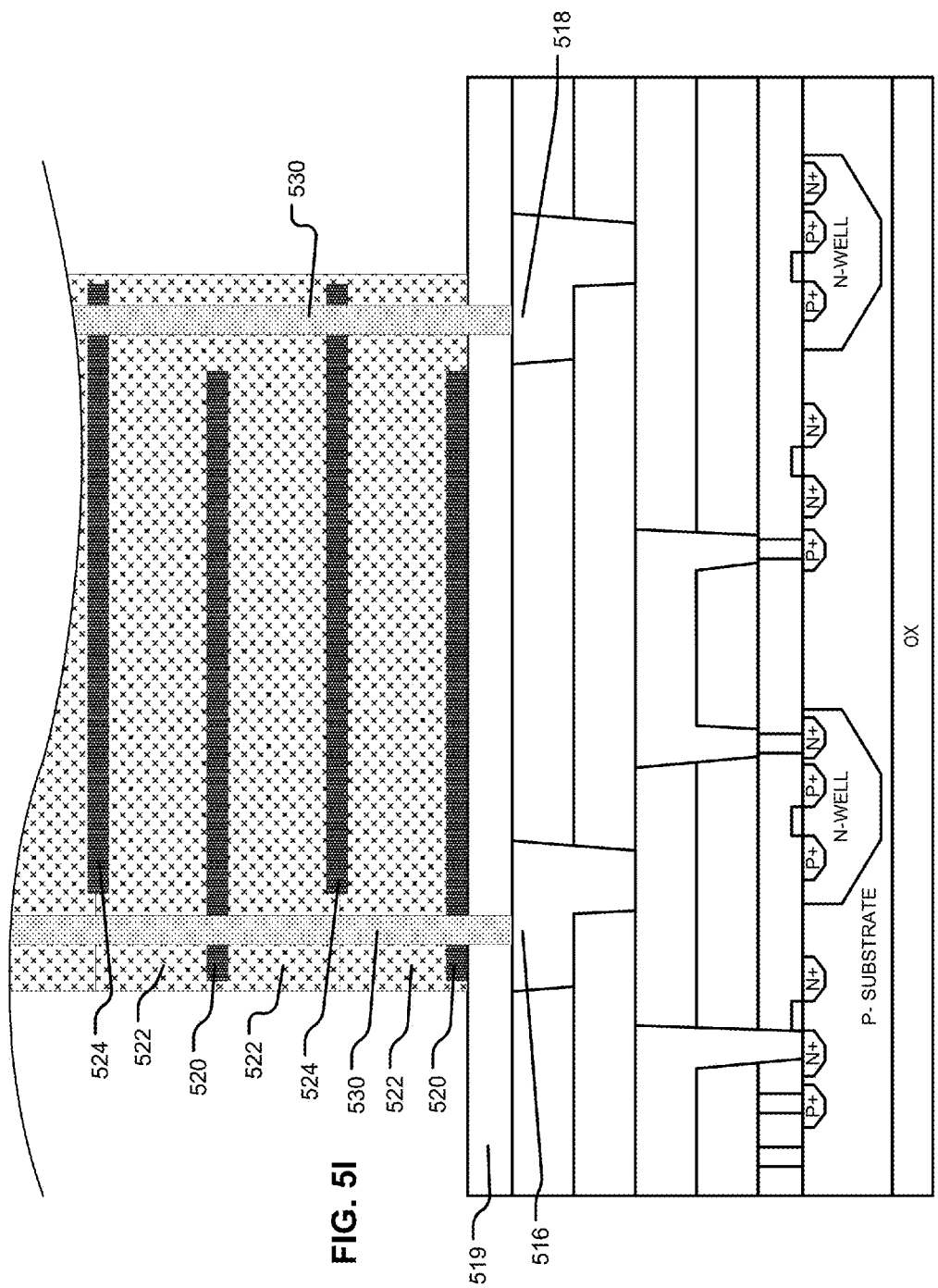

Once the predetermined number of sub capacitors are formed, for example 5000 odd layers and 5000 even layers, step 505 of patterning and forming a first and second via is performed, also using masks prepared in step 430. As shown in FIG. 5H, the first via 526 is formed through the odd layers and bypasses the even layers, and the second via 528 is formed through the even layers and bypasses the odd layers. In embodiments, the vias are laser etched to extend through all the sub-capacitor layers to the passivation layer 519 and a chemical etch is then performed in order to expose the contact pads 516 and 518, as is shown in FIG. 5H. In step 506 the vias are filled with a conductive material to form interlayer conductors 530 and connect the capacitor electrically with the contact pads 516 and 518, as is shown in FIG. 5I.

Many further steps are typically performed thereafter, which will be apparent to the reader.

Since the features on the capacitor device made using the fabrication process of FIG. 5 are formed using masks created using the layout principles described elsewhere herein, it will be appreciated that aspects of the invention are reflected in the fabrication process.

Further, a capacitor device made using the fabrication process of FIG. 5 may be simulated with EDA software for various design and verification purposes. The simulated device may be part of a simulated integrated circuit and various parameters of the capacitor device may be extracted using the simulated model of the capacitor.

A typical integrated circuit manufacturing flow, including manufacturing a capacitor as described herein, also includes a related flow, as follows:

(1) Develop individual process steps for manufacturing the integrated circuit, including manufacturing a capacitor. This can be modeled with the Synopsys tools "Sentaurus Process" and "Sentaurus Topography". The input information here includes process conditions like temperature, reactor ambient, implant energy, etc. The output information is the changes in geometry or doping profiles or stress distribution. Aspects of the invention can be used in this step of the manufacturing flow.

(2) Integrate the individual process steps into the complete process flow. This can be modeled with the Synopsys tool "Sentaurus Process". The input information here includes the collection of the process steps in the appropriate sequence. The output includes a database describing the physical structures of the resulting device. Aspects of the invention can be used also in this step of the manufacturing flow.

(3) Analyze performance of the capacitor manufactured with this process flow. This can be done with the Synopsys tool "Sentaurus Device", see FIGS. 4B and 4C described below. The input information here includes the output of step (2) and the various electrical conditions that the capacitor will experience at the contact pad 516, 518. The output information includes capacitance values, leakage, and dynamical properties such as charge time profile. Aspects of the invention can be used also in this step of the manufacturing flow.

The output information developed in step (3) characterizes the capacitors made using the process, and the characteristics are then provided to circuit simulators such as HSPICE in order to permit a designer to analyze circuit designs at a transistor level. By analyzing the circuit at a transistor level, the designer is able to develop better designs.

(4) If necessary, modify the process steps and the process flow to achieve the desired capacitor performance. This can be done iteratively by using the Synopsys tools mentioned above.

Once the process flow is ready, it can be used for manufacturing multiple circuit designs coming from various designers in various companies. The EDA flow 412-430 will be used by such designers. The parallel flow described here can be used for example at a foundry to develop a process flow that can be used to manufacture designs coming from the designers. A combination of the process flow and the masks made from step 430 are used to manufacture any particular circuit. If the designers are at a different company, e.g. a fabless company, then usually it is the foundry that performs this parallel process flow whereas the process steps of FIG. 4 are performed typically by the fabless company. If the integrated circuit is manufactured at an IDM (integrated device manufacturer) company instead of the combination of a fabless company and a foundry, then both parallel flows described above are done at the same IDM company.

Figure 4A:
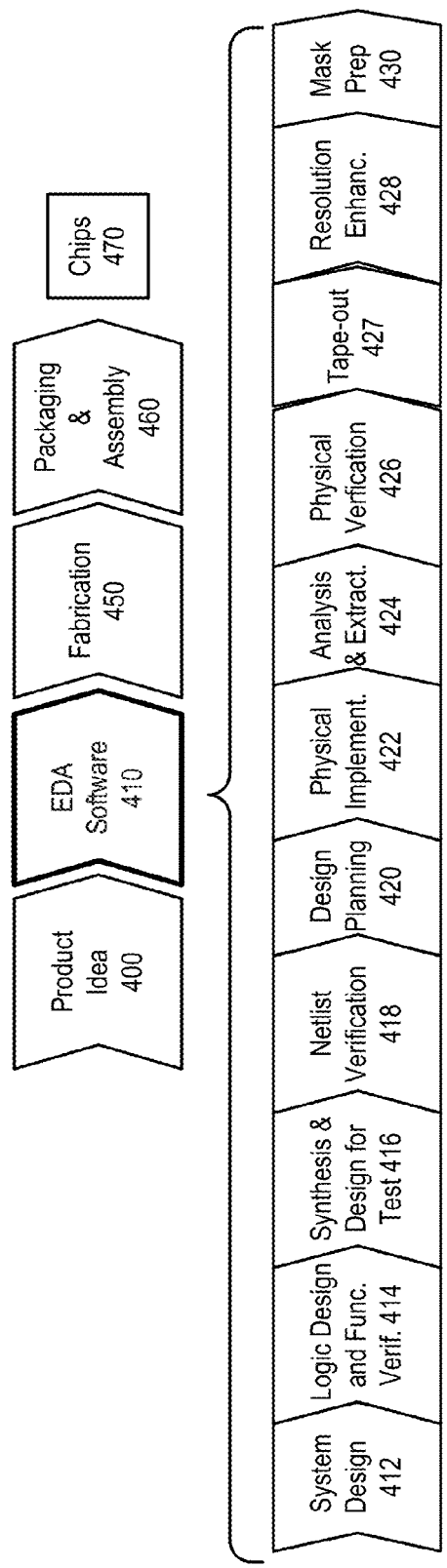
FIG. 4A shows a simplified representation of an illustrative digital integrated circuit design flow.
Figure 4B:
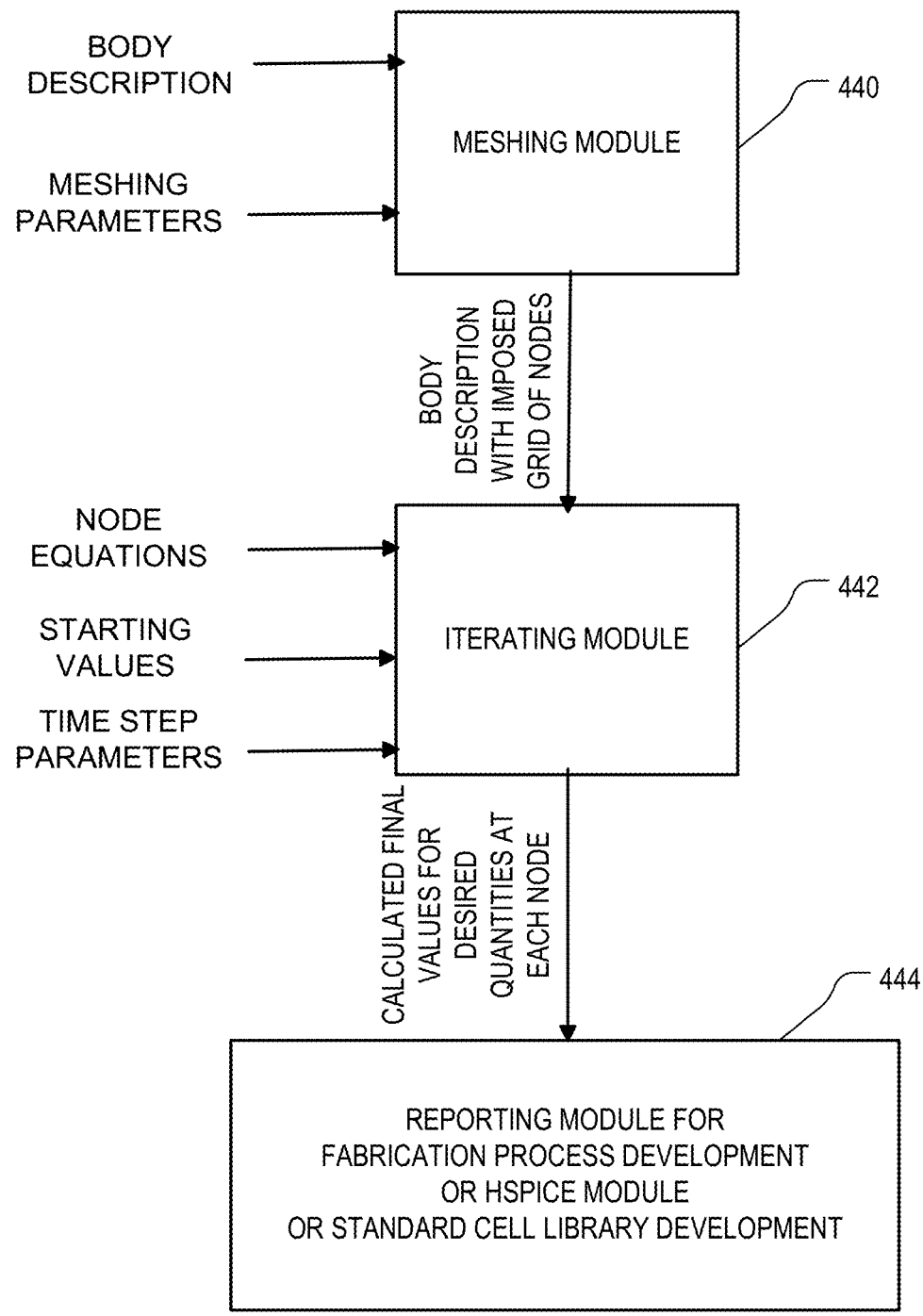
FIG. 4B illustrates the use of a system implementing aspects of the invention in the related flow.
Figure 4C:
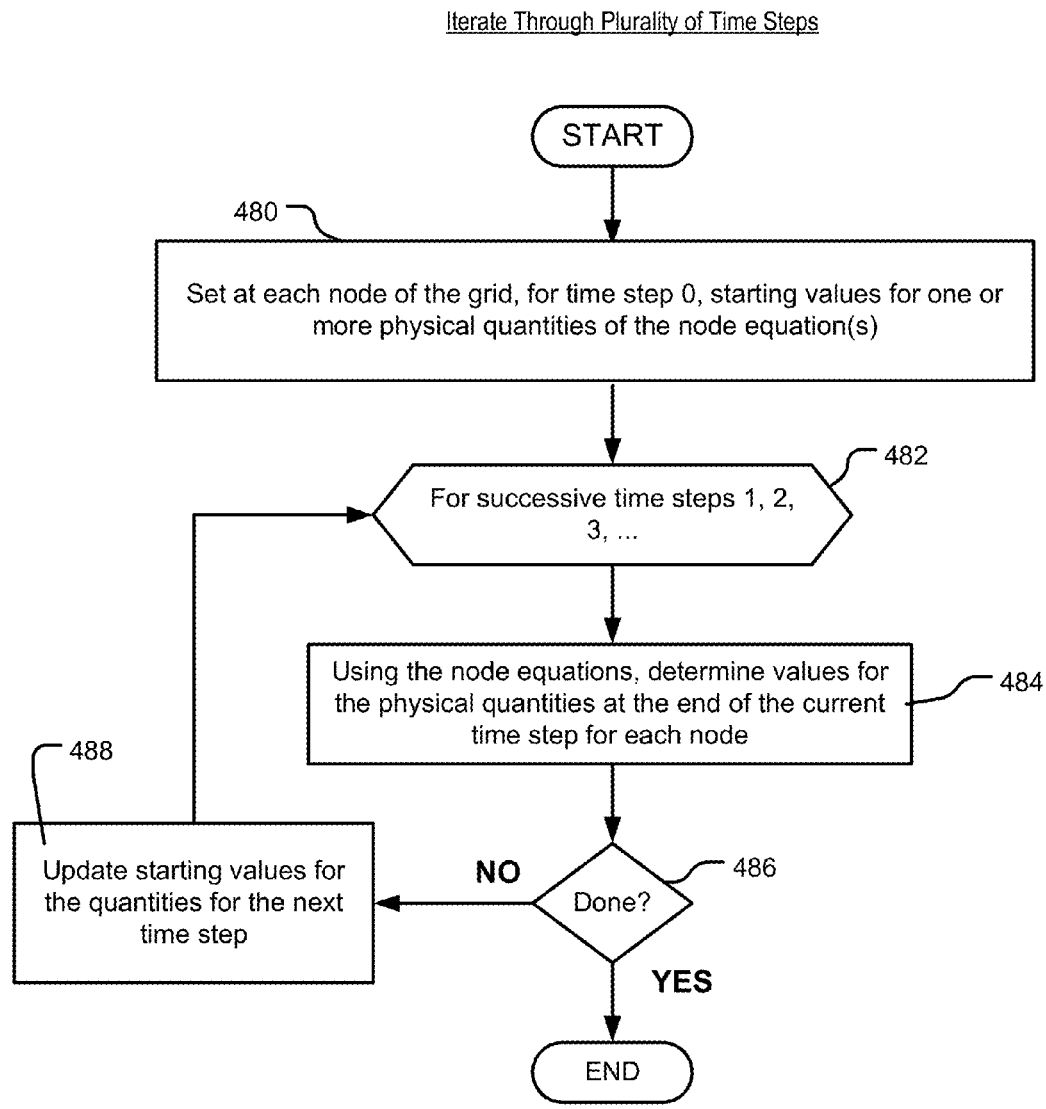
FIG. 4C is a flow chart detailing of logic in iterating module.

FIGS. 4B and 4C illustrate how a TCAD system such as Sentaurus Device can analyze the characteristics of a capacitor according to the invention. Referring to FIG. 4B, the system includes a meshing module 440, which receives as impute a description of the body to be modeled, and any parameters to be used in imposing the mesh on the body.

Module 440 creates a grid of nodes in the body to be modeled (e.g. the capacitor), in the sense that each node is assigned a position in or around the body. A node data structure is populated for each node, which includes an indication of the position of the grid node in the body (in three dimensions), and values for various properties of the body at that position.

Meshing module 440 outputs a description of the body with the imposed grid of nodes. The output is in a predefined format. In one embodiment the output is written to a non-transitory computer readable medium such as a disk drive or computer memory.

The output of meshing module 440 is provided to an iterating module 442, which may include a Technology Computer Aided Design (TCAD) module, such as Sentaurus Process, Sentaurus Topography, or Sentaurus Device, all available from Synopsys, Inc., Mountain View, Calif. Different ones of these tools would be used as iterating module 442, depending on the particular type of equation to be solved or process to be modeled. For temporal processes or ramping of bias conditions, the iterating module 442 models the behavior of a material structure, by simulating the behavior on a computer system. A user also provides the node equations to iterating module 442, starting values for various quantities referenced in the node equations as well as time step parameters if applicable to the problem (such as the duration of each time step and the maximum number of time steps to calculate).

Iterating module 442 provides as output an indication of the values calculated by the simulation, for the quantity or quantities of interest, as they are predicted to be at each node of the grid at the end of the simulation period. Like the output of meshing module 440, the output of iterating module 442 is provided in a predefined format. The output is reported to a user by a reporting module 444. In one embodiment the output is written to a non-transitory computer readable medium such as a disk drive or computer memory, and in a further embodiment the output can be provided to a visualization module which presents the distribution of quantities across the body in a visual form which simplifies user interpretation of the results.

The results are then used, in various embodiments, for a variety of real world aspects of building or improving integrated circuit devices. In one embodiment, for example, the results are used to develop or improve a fabrication process flow that can be used to manufacture designs. A combination of the process flow and the masks made from step 430 are used to manufacture any particular circuit, particularly including a capacitor such as that described herein. In another embodiment the results are used to characterize or improve transistors, capacitors and other devices. In other embodiments the results are used to develop HSPICE models of the capacitor or other integrated circuit devices, in order to enable designers to develop better circuit designs and layouts. In yet other embodiments the results are used to improve process flow to achieve the desired transistor and capacitor performance. Thus the numerical values obtained by the methods and systems described herein are used for real world technological development or implementation of semiconductor manufacturing processes or circuit designs.

The node equations provided to iterating module 442, in various embodiments of the invention, use Scharfetter-Gummel discretized approximations of the partial differential equations describing the physical phenomenon to be modeled.

FIG. 4C is a flow chart detail of logic in iterating module 442 (FIG. 4B) for iteratively determining values for the physical quantities of the body at the end of a plurality of time steps in a CAD system, where a temporal or bias ramping process is to be simulated. Note that "time" in this scheme can be considered as real time (transient problem), or some parameter variation (steady-state problems). The most common example of the latter case is bias ramping. Such "dual" meaning of time is meant in FIG. 4C, and can be applied to appropriate descriptions below.

The logic of FIG. 4C can be implemented using processors programmed using computer programs stored in memory accessible to the computer systems and executable by the processors, by dedicated logic hardware, including field programmable integrated circuits, or by combinations of dedicated logic hardware and computer programs. Each block in the flowchart may represent in various embodiments a module, segment, or portion of code, which comprises one or more executable instructions (which may or may not be contiguous) for implementing the specified logical function(s). As with all flowcharts herein, it will be appreciated that many of the steps can be combined, performed in parallel or performed in a different sequence without affecting the functions achieved. In some cases, as the reader will appreciate, a re-arrangement of steps will achieve the same results only if certain other changes are made as well. In other cases, as the reader will appreciate, a re-arrangement of steps will achieve the same results only if certain conditions are satisfied. Furthermore, it will be appreciated that the flow charts herein show only steps that are pertinent to an understanding of the invention, and it will be understood that in a specific embodiment, numerous additional steps for accomplishing other functions for that embodiment can be performed before, after and between those steps shown.

Each step illustrated in the flow chart describes logic that can be implemented in hardware or in software running on one or more computing processes executing on one or more computer systems. Since most simulations of this type are extremely compute intensive, usually requiring hours to perform on advanced computer hardware, at least some of the illustrated steps cannot reasonably be performed in the human mind. In one embodiment, each step of the flow chart illustrates the function of a separate module of software. In another embodiment, the logic of the step is performed by software code routines which are distributed throughout more than one module.

Prior to starting FIG. 4C, the node equations also have already been provided and, in some embodiments, boundary conditions have been established at certain nodes. For example, the method can assign values of zero fluxes at nodes at the boundaries of the grid (e.g., as for a reflective boundary condition).

In step 480, the method sets, at each node of the grid, for time step 0, starting values for one or more physical quantities of the node equation(s). For example, the method can set starting values of electron density at each node of the grid. Typically the starting values can be either zero or certain equilibrium values that can be easily calculated.

For each successive time step 1, 2, 3, and so on (Step 482), the method uses the node equations to calculate values for the physical quantities at the end of the current time step for each node (step 484). For example, if the node equations form a system of simultaneous equations (a finite set of equations in the same unknowns, of which the common solutions are to be determined), then the system can be solved using any of a number of well-known methods for solving such a system of equations "as simultaneous equations." For example, the system of node equations can be transformed into a matrix system, in which an off-diagonal element in the matrix system represents interactions (e.g., flux) between a pair of adjacent nodes in the grid. The matrix system at the current time step then can be solved iteratively by a suitable numerical method such as Newton's method. Newton's Method, as well as some advantageous modifications thereof, are described, for example, in U.S. Pat. No. 7,302,375, by inventors Kucherov and Moroz, incorporated by reference herein. The method also records values of the quantities after the matrix system is solved for the current time step.

At Step 486, the method determines whether the solution at the current time step is satisfactory. For example, the method can determine whether the solution has converged within a specified threshold. If the solution is satisfactory at the current time step, the method of FIG. 4C ends. In addition, the method can report to a user via a user interface the final state of the body (e.g., values of the quantities of interest at the grid nodes). The report can take the form of numeric values, for example, or a visualization.

If the solution at the current time step is not satisfactory, the method updates starting values of the quantities for the next time step (Step 488). For example, the method can update starting values of the quantities for the next time step using the values determined for the quantities at the current time step. Then the method repeats the loop of Steps 482, 484, 486, and 488, until a convergence condition is reached. Alternatively or additionally, the method can terminate the loop of Step 482, 484, 486, and 488 after the iteration has been carried out for a specified number of time steps as indicated in the time step parameters (FIG. 4B).

Note that the above description of FIG. 4C can also solve equations for bias ramping processes by iterating through bias values rather than time. In some embodiments, the flow is executed for only a single iteration.

Layout Geometry Files

The layout of a circuit design such as stacked capacitor device may be formed in step 422 (Physical Implementation). The layout is represented in a geometry file or database on a computer readable medium which defines, among other things, all the shapes to be formed on each mask that will be used to expose the deposited layers during fabrication. A "computer readable medium", as the term is used herein, may include more than one physical item, such as more than one disk, or RAM segments or both, which need not all be present at a single location. As used herein, the term does not include mere time varying signals in which the information is encoded in the way the signal varies over time. The geometry file can have any of several standard formats, such as GDSII, OASIS, CREF, and so on, or it can have a non-standard format. The file describes the layout of the circuit design in the form of a mask definition for each of the masks to be generated. Each mask definition defines a plurality of polygons.

Macrocell Implementations

A circuit or layout that includes a stacked capacitor device as described herein can be designed in advance and provided to designers as a macrocell (which as used herein can be a standard cell). It is common for integrated circuit designers to take advantage of macrocells that have been pre-designed for particular kinds of circuits, such as logic gates, larger logic functions, memory (including SRAM) and even entire processors or systems. These macrocells are provided in a library available from various sources, such as foundries, ASIC companies, semiconductor companies, third party IP providers, and even EDA companies, and used by designers when designing larger circuits. Each macrocell typically includes such information as a graphical symbol for schematic drawings; text for a hardware description language such as Verilog; a netlist describing the devices in the included circuit, the interconnections among them, and the input and output nodes; a layout (physical representation) of the circuit in one or more geometry description languages such as GDSII; an abstract of the included geometries for use by place-and-route systems; a design rule check deck; simulation models for use by logic simulators and circuit simulators; and so on. Some libraries may include less information for each macrocell, and others may include more. In some libraries the entries are provided in separate files, whereas in others they are combined into a single file, or one file containing the entries for multiple different macrocells. In all cases the files are either stored and distributed on a computer readable medium, or delivered electronically and stored by the user on a computer readable medium. Macrocell libraries often contain multiple versions of the same logic function differing in area, speed and/or power consumption, and in particular references to a super capacitor as describe herein, area and layer count. These variations allow designers or automated tools the option to trade off among these characteristics. A macrocell library can also be thought of as a database of macrocells. As used herein, the term "database" does not necessarily imply any unity of structure. For example, two or more separate databases, when considered together, still constitute a "database" as that term is used herein. As such, the entries defining each single macrocell can also be thought of as a "database". It can be seen that aspects of the invention also may be present in macrocells and macrocell libraries.

Computer System

Figure 6:
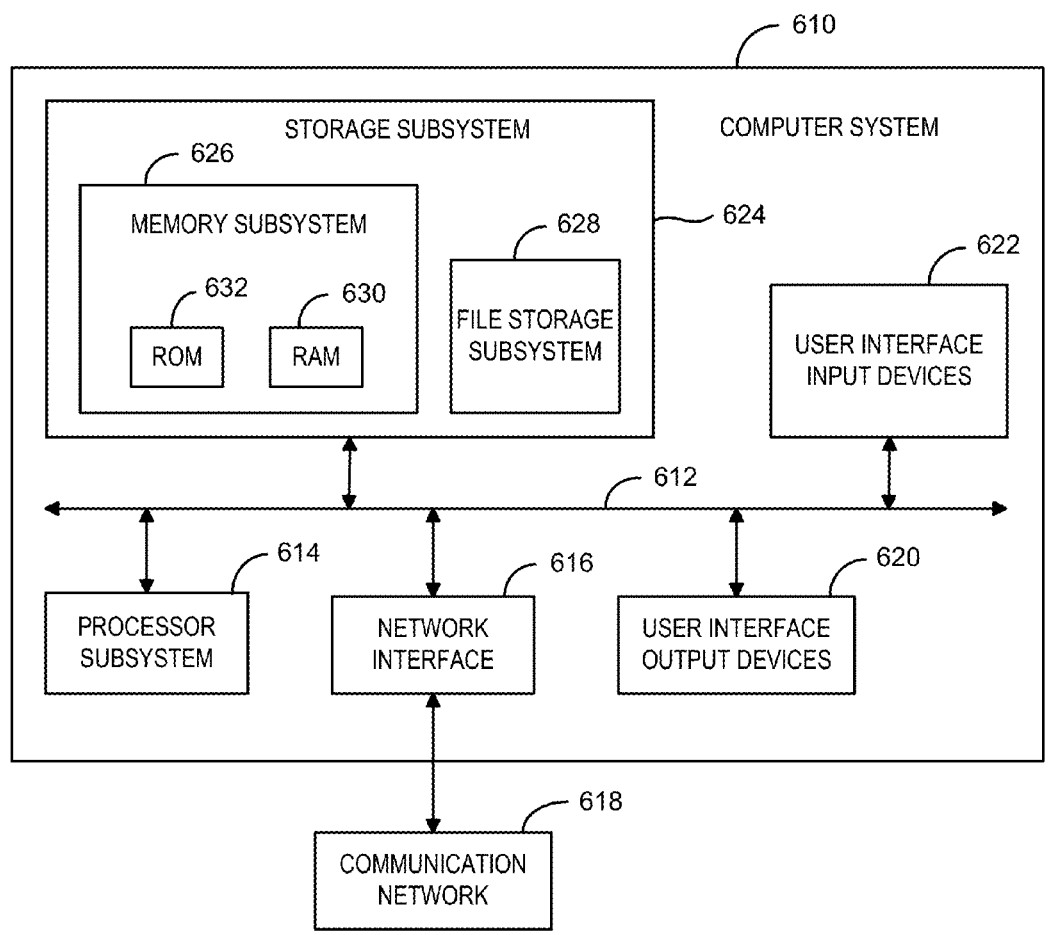
FIG. 6 is a simplified block diagram of a computer system that can be used to perform many of the computer-based steps described herein.

FIG. 6 is a simplified block diagram of a computer system 610 that can be used to perform many of the steps of FIGS. 4A, 4B, and 4C, including reading and interpreting layout geometry files, macrocells and macrocell libraries.

Computer system 610 typically includes a processor subsystem 614 which communicates with a number of peripheral devices via bus subsystem 612. These peripheral devices may include a storage subsystem 624, comprising a memory subsystem 626 and a file storage subsystem 628, user interface input devices 622, user interface output devices 620, and a network interface subsystem 616. The input and output devices allow user interaction with computer system 610. Network interface subsystem 616 provides an interface to outside networks, including an interface to communication network 618, and is coupled via communication network 618 to corresponding interface devices in other computer systems. Communication network 618 may comprise many interconnected computer systems and communication links. These communication links may be wireline links, optical links, wireless links, or any other mechanisms for communication of information, but typically it is an IP-based communication network. While in one embodiment, communication network 618 is the Internet, in other embodiments, communication network 618 may be any suitable computer network.

The physical hardware component of network interfaces are sometimes referred to as network interface cards (NICs), although they need not be in the form of cards: for instance they could be in the form of integrated circuits (ICs) and connectors fitted directly onto a motherboard, or in the form of macrocells fabricated on a single integrated circuit chip with other components of the computer system.

User interface input devices 622 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 610 or onto computer network 618.

User interface output devices 620 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computer system 610 to the user or to another machine or computer system.

Storage subsystem 624 stores the basic programming and data constructs that provide the functionality of certain embodiments of the present invention. For example, the various modules implementing the functionality of certain embodiments of the invention may be stored in storage subsystem 624. These software modules are generally executed by processor subsystem 614.

Memory subsystem 626 typically includes a number of memories including a main random access memory (RAM) 630 for storage of instructions and data during program execution and a read only memory (ROM) 632 in which fixed instructions are stored. File storage subsystem 628 provides persistent storage for program and data files, and may include a hard disk drive, a floppy disk drive along with associated removable media, a CD ROM drive, an optical drive, or removable media cartridges. The databases and modules implementing the functionality of certain embodiments of the invention may have been provided on a computer readable medium such as one or more CD-ROMs, and may be stored by file storage subsystem 628. The host memory 626 contains, among other things, computer instructions which, when executed by the processor subsystem 614, cause the computer system to operate or perform functions as described herein. As used herein, processes and software that are said to run in or on "the host" or "the computer", execute on the processor subsystem 614 in response to computer instructions and data in the host memory subsystem 626 including any other local or remote storage for such instructions and data.

Bus subsystem 612 provides a mechanism for letting the various components and subsystems of computer system 610 communicate with each other as intended. Although bus subsystem 612 is shown schematically as a single bus, alternative embodiments of the bus subsystem may use multiple busses.

Computer system 610 itself can be of varying types including a personal computer, a portable computer, a workstation, a computer terminal, a network computer, a television, a mainframe, a server farm, or any other data processing system or user device. Due to the ever-changing nature of computers and networks, the description of computer system 610 depicted in FIG. 6 is intended only as a specific example for purposes of illustrating the preferred embodiments of the present invention. Many other configurations of computer system 610 are possible having more or less components than the computer system depicted in FIG. 6.

The applicants hereby disclose in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicants indicate that aspects of the present invention may consist of any such feature or combination of features. In view of the foregoing description it will be evident to a person skilled in the art that various modifications may be made within the scope of the invention.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. For example, while the capacitor device has been described as an energy storage means, the capacitor device may also be used in analog circuits, for example for filtering purposes.

In particular, and without limitation, any and all variations described, suggested or incorporated by reference in the Background section of this patent application are specifically incorporated by reference into the description herein of embodiments of the invention. In addition, any and all variations described, suggested or incorporated by reference herein with respect to any one embodiment are also to be considered taught with respect to all other embodiments. The embodiments described herein were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A multilayer capacitor comprising:
   a first set of conductive layers all connected to a first terminal of the capacitor and each comprising a first 2D material; and
   a second set of conductive layers all connected to a second terminal of the capacitor and each comprising a second 2D material,
   wherein the layers in the first set of conductive layers are interleaved with the layers in the second set of conductive layers and separated from the layers in the second set of conductive layers by intervening layers of dielectric material, wherein the first and second sets of conductive layers together include at least 5,000 conductive layers, and
   wherein the multilayer capacitor is integrated in an integrated circuit.

2. The multilayer capacitor of claim 1, wherein the first and second sets of conductive layers together include at least 10,000 conductive layers.

3. The multilayer capacitor of claim 2, wherein the first and second 2D materials are graphene, and
   wherein the total thickness of the first set of conductive layers, the second set of conductive layers, and the plurality of dielectric layers is less than 25 µm.

4. The multilayer capacitor of claim 2, wherein the total capacitance of the multilayer capacitor is at least 20 mF.

5. The multilayer capacitor of claim 3, wherein the first and second 2D materials are graphene, and
   wherein the total thickness of the first set of conductive layers, the second set of conductive layers, and the plurality of dielectric layers is less than 100 µm.

6. The multilayer capacitor of claim 1, wherein the multilayer capacitor has a total capacitance of at least 20 mF.

7. A multilayer capacitor comprising:
   a first set of conductive layers all connected to a first terminal of the capacitor and each comprising a first 2D material; and
   a second set of conductive layers all connected to a second terminal of the capacitor and each comprising a second 2D material,
   wherein the layers in the first set of conductive layers are interleaved with the layers in the second set of conductive layers and separated from the layers in the second set of conductive layers by intervening layers of dielectric material,
   wherein the first and second 2D materials are graphene, and
   wherein the capacitance per unit area of a sub-capacitor formed by a graphene electrode of the first set, a graphene electrode of the second set and a dielectric layer of the plurality of dielectric layers is at least 1 µF/cm$^2$.

8. The multilayer capacitor of claim 7, wherein the capacitance per unit area of a sub-capacitor formed by a graphene electrode of the first set, a graphene electrode of the second set and a dielectric layer of the plurality of dielectric layers is at least 7 µF/cm$^2$.

9. The multilayer capacitor of claim 8, wherein the total capacitance of the sub-capacitor is at least 2.5 µF.

10. A multilayer capacitor device comprising:
a first capacitor including:
   a first 2D material electrode,
   a first dielectric layer immediately overlying the first 2D material electrode, and
   a second 2D material electrode, the second 2D material electrode having topside and bottomside surface, the bottomside surface of the second 2D material electrode immediately overlying the first dielectric layer;
a second capacitor including:
   a third 2D material electrode, and
   a second dielectric layer immediately underlying the third 2D material electrode and immediately overlying the topside surface of the second 2D material electrode; and
an interlayer conductor electrically coupling the first 2D material electrode and the third 2D material electrode,
wherein the first 2D material electrode, the first dielectric layer, and the second 2D material electrode have a total thickness of less than 3 nm.

11. A method of manufacture of a stacked capacitor device on a substrate having formed therein a plurality of active devices, a plurality of conductive interconnect layers formed above the substrate, and including a top interconnect layer having first and second conductive pads; the method comprising the steps of:
   forming a first capacitor above the top interconnect layer, including:
      forming a first conductive 2D material electrode;
      forming a first dielectric layer immediately overlying the first 2D material electrode; and
      forming a second conductive 2D material electrode immediately overlying the first dielectric layer;
   forming a second capacitor including:
      forming a second dielectric layer immediately overlying the second 2D material electrode; and
      forming a third conductive 2D material electrode immediately overlying the second dielectric layer;
   connecting the first and third 2D material electrodes to the first conductive pad; and
   connecting the second 2D material electrode to the second conductive pad,
   wherein the first 2D material electrode, the first dielectric layer, and the second 2D material electrode have a total thickness of less than 3 nm.

12. The method of claim 11 further comprising the steps of:
   forming a third capacitor including:
      forming a third dielectric layer immediately overlying the third 2D material electrode; and
      forming a fourth conductive 2D material electrode immediately overlying the third dielectric layer; and
   connecting the fourth 2D material electrode to the second conductive pad.

13. The method of claim 11, wherein the first, second and third conductive 2D material electrodes each comprise graphene.

14. The method of claim 11, wherein the first, second, and third conductive 2D material electrodes each comprises a same 2D material.

15. The method of claim 11, wherein the first conductive 2D material electrode and the second conductive 2D material electrode each comprises graphene, and the capacitance per unit area of the first capacitor is a least 7 $\mu F/cm^2$.

16. The method of claim 11, wherein the first conductive 2D material electrode and the second conductive 2D material electrode each comprises graphene, and the capacitance per unit area of the first capacitor is a least 1 $\mu F/cm^2$.

17. The method of claim 11, wherein the total capacitance of the first capacitor is at least 2.5 µF.

* * * * *